(12) United States Patent
Wong et al.

(10) Patent No.: US 12,266,559 B2
(45) Date of Patent: Apr. 1, 2025

(54) METHOD OF MANUFACTURING SEMICONDUCTOR PACKAGE, METHOD OF HANDLING WAFER, AND METHOD OF HANDLING WORKPIECE

(71) Applicant: Taiwan Semiconductor Manufacturing Company, Ltd., Hsinchu (TW)

(72) Inventors: Cheng-Shiuan Wong, Hsinchu (TW); Chih-Chiang Tsao, Taoyuan (TW); Chao-Wei Chiu, Hsinchu (TW); Hao-Jan Pei, Hsinchu (TW); Wei-Yu Chen, Taipei (TW); Hsiu-Jen Lin, Hsinchu County (TW); Ching-Hua Hsieh, Hsinchu (TW); Chia-Shen Cheng, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/358,948

(22) Filed: Jul. 26, 2023

(65) Prior Publication Data
US 2023/0369094 A1 Nov. 16, 2023

Related U.S. Application Data

(62) Division of application No. 17/010,855, filed on Sep. 3, 2020, now Pat. No. 11,791,192.

(Continued)

(51) Int. Cl.
*H01L 21/68* (2006.01)
*H01L 21/56* (2006.01)
(Continued)

(52) U.S. Cl.
CPC .......... *H01L 21/6838* (2013.01); *H01L 21/56* (2013.01); *H01L 21/6836* (2013.01);
(Continued)

(58) Field of Classification Search
CPC . H01L 21/6838; H01L 21/56; H01L 21/6836; H01L 21/68721; H01L 24/03;
(Continued)

(56) References Cited

U.S. PATENT DOCUMENTS 6,117,349 A * 9/2000 Huang ............ H01J 37/32431
                                            438/729
6,196,532 B1 * 3/2001 Otwell ................ H01L 21/6838
                                            269/21

(Continued)

FOREIGN PATENT DOCUMENTS

CN      1537328 A  * 10/2004   ....... H01L 21/67103
CN    108796466 B  *  6/2020   ............. C23C 14/50
(Continued)

*Primary Examiner* — Mohammed Shamsuzzaman
(74) *Attorney, Agent, or Firm* — JCIPRNET (57) ABSTRACT

A method of handling a workpiece includes the following steps. A workpiece is placed on a chuck body, wherein the workpiece includes a tape carrier extending beyond a periphery of the chuck body and a workpiece body disposed on the tape carrier, and the chuck body includes a seal ring surrounding the periphery of the chuck body; the tape carrier is clamped outside the chuck body, wherein the tape carrier leans against the seal ring and an enclosed space is formed between the chuck body, the tape carrier and the seal ring; and a vacuum seal is formed by evacuating gas from the enclosed space to pull the periphery of the workpiece toward the chuck body.

20 Claims, 10 Drawing Sheets

Related U.S. Application Data

(60) Provisional application No. 62/963,149, filed on Jan. 19, 2020.

(51) Int. Cl.
*H01L 21/683* (2006.01)
*H01L 21/687* (2006.01)
*H01L 23/00* (2006.01)

(52) U.S. Cl.
CPC ........ *H01L 21/68721* (2013.01); *H01L 24/03* (2013.01); *H01L 2224/0231* (2013.01); *H01L 2224/02379* (2013.01)

(58) Field of Classification Search
CPC ... H01L 2224/0231; H01L 2224/02379; H01L 24/19; H01L 23/3128; H01L 2221/68345; H01L 2221/68359; H01L 2221/68368; H01L 2224/04105; H01L 2224/12105; H01L 2224/18; H01L 2224/32225; H01L 2224/73267; H01L 2224/92244; H01L 2924/3511; H01L 21/67126; H01L 21/6835; H01L 21/68735; H01L 21/67132
See application file for complete search history.

(56) References Cited

U.S. PATENT DOCUMENTS

| | | | | |
|---|---|---|---|---|
| 6,540,899 | B2* | 4/2003 | Keigler | C25D 17/06 204/297.05 |
| 6,547,559 | B1* | 4/2003 | Hodos | H01L 21/68721 269/21 |
| 10,930,543 | B2* | 2/2021 | Ngo | H01L 21/6875 |
| 11,201,079 | B2* | 12/2021 | Liao | H01L 21/6875 |
| 11,476,151 | B2* | 10/2022 | Ji | H01L 21/67103 |
| 2002/0043337 | A1* | 4/2002 | Goodman | H01L 21/68728 156/345.12 |
| 2007/0026640 | A1* | 2/2007 | Priewasser | H01L 21/67132 438/460 |
| 2009/0179366 | A1* | 7/2009 | Herchen | H01L 21/67126 269/21 |
| 2010/0013169 | A1* | 1/2010 | Monteen | H01L 21/6838 279/3 |
| 2013/0156947 | A1* | 6/2013 | Tseng | H01L 21/6838 279/3 |
| 2014/0008855 | A1* | 1/2014 | Cheng | B28D 5/0094 269/21 |
| 2014/0116920 | A1* | 5/2014 | Lee | B65D 81/2015 53/485 |
| 2014/0182788 | A1* | 7/2014 | Falster | H01L 21/6875 156/443 |
| 2015/0371882 | A1* | 12/2015 | Tsai | C23C 16/52 118/712 |
| 2015/0380357 | A1* | 12/2015 | Liu | H01L 23/544 257/737 |
| 2016/0148828 | A1* | 5/2016 | Parkhe | H01L 21/67109 361/234 |
| 2017/0103908 | A1* | 4/2017 | Lew | H01L 21/6838 |
| 2018/0166314 | A1* | 6/2018 | Ellis | H01L 21/6875 |
| 2018/0193983 | A1* | 7/2018 | Ishino | H01L 21/6838 |
| 2019/0371646 | A1* | 12/2019 | Liao | H01L 21/6838 |

FOREIGN PATENT DOCUMENTS

| | | | | |
|---|---|---|---|---|
| CN | 112242339 | A * | 1/2021 | ........... B25B 11/005 |
| DE | 102010026610 | A1 * | 1/2012 | ......... H01L 21/6838 |
| WO | WO-2015179192 | A1 * | 11/2015 | ........ H01J 37/32091 |

* cited by examiner

METHOD OF MANUFACTURING SEMICONDUCTOR PACKAGE, METHOD OF HANDLING WAFER, AND METHOD OF HANDLING WORKPIECE

CROSS-REFERENCE TO RELATED APPLICATION

This is a divisional application of U.S. application Ser. No. 17/010,855, filed on Sep. 3, 2020, now allowed, which claims the priority benefit of U.S. provisional application Ser. No. 62/963,149, filed on Jan. 19, 2020. The entirety of each of the above-mentioned patent applications is hereby incorporated by reference herein and made a part of this specification.

BACKGROUND

Larger wafers hold more chips and can reduce per-chip cost. Accordingly, wafers having large sizes are now commonly used in semiconductor manufacturing processes. Although the wafers having large sizes can be used to reduce manufacturing cost, larger wafers introduce new issues that were not previously considered in smaller wafers. One critical issue is the wafer warpage which has become more severe with larger wafers.

Wafer warpage causes many undesired manufacturing defects. For example, a spun-on layer on the wafer may have a larger thickness at the center than the outer edge. In an etching process, critical dimension (CD) uniformity problem from wafer center to edge at least partly comes from imperfect chucking over wafer warpage. Moreover, in a photolithographic process, a photoresist (PR) layer's thickness uniformity from wafer center to outer edge is critical. During exposure, wafer warpage induced focus drift can be disastrous for CD uniformity. Also, residual stresses in a warped wafer have been observed to result in cracks in the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 1:
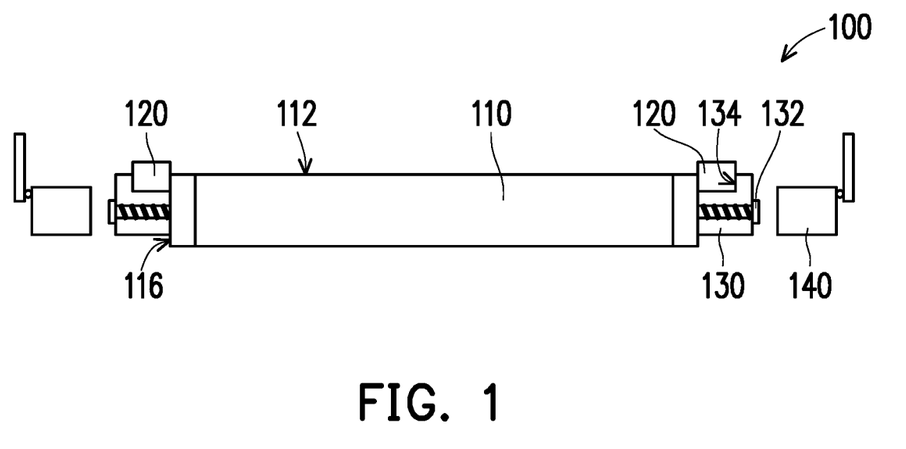
FIG. 1 illustrates a cross sectional view of a workpiece holder according to some exemplary embodiments of the present disclosure.

FIG. 1 illustrates a cross sectional view of a workpiece holder according to some exemplary embodiments of the present disclosure. FIG. 2 to FIG. 8 illustrate cross sectional views of intermediate stages in the manufacturing of a semiconductor package according to some exemplary embodiments of the present disclosure. It is appreciated that only the main components of the workpiece holder 100 are shown. Nuts, bolts, screws, fittings, etc. which are required to assemble the workpiece holder 100, are not shown in detail in figures, in order not to clutter the illustration. Referring to FIG. 1 and FIG. 8, in some embodiments, a workpiece holder 100 is configured to hold a workpiece 200 and retain the workpiece 200 in a fixed position for sequential process. In some embodiments, the workpiece 200 may include carrier 220 and a workpiece body 210 disposed on the carrier 220.

In the fabrication of semiconductor devices, a wafer must be process by many processing steps, i.e. as many as several hundred, in order to produce a final product of an integrated circuit (IC) chip. In the various chemical or physical processes for performing the fabrication steps, a wafer must be held onto a wafer carrying device, such as a wafer chuck securely in a process chamber such that an active surface of the wafer can be processed. In accordance with some embodiments of the disclosure, the workpiece body 210 may be a wafer, and the carrier 220 may be a tape carrier. In such embodiments, the workpiece holder 100 may be referred to as a wafer chuck 100, which is configured to hold the wafer 210 and retain the wafer 210 in a fixed position in order to uniformly process the wafer 210 in a semiconductor wafer processing process, such as chemical mechanical polishing (CMP), laser drilling, solder paste printing, die sawing. The disclosure is not limited thereto. Different processes may be applied to create the wafer 210 with different patterns and feature sizes. For example, to manufacture patterns, lithography, x-ray lithography, imprint lithography, photolithography, etc., may be used.

Figure 2:
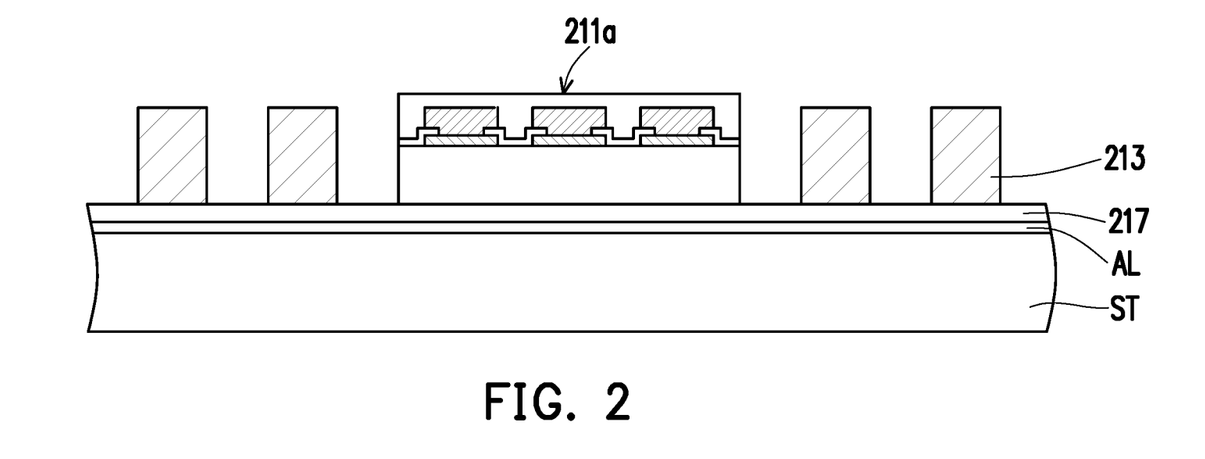
FIG. 2 to FIG. 8 illustrate cross sectional views of intermediate stages in the manufacturing of a semiconductor package according to some exemplary embodiments of the present disclosure.

In some embodiments, the wafer 210 may be referred to as a reconstructed wafer, a reconstructed panel, reconstructed substrate, or the like. For example, in a plane view, the wafer 210 may have a circular shape, a rectangular shape, or the like. A plurality of semiconductor devices may be arranged as an array in the reconstructed wafer, reconstructed panel or the reconstructed substrate. For example, the manufacturing process of the reconstructed wafer 210 may include the following steps. Referring to FIG. 2, at least one semiconductor device 211a (one semiconductor device 211a is illustrated but an array of semiconductor devices may be expected) is provided on a substrate ST. An adhesive layer AL may be disposed on the substrate ST. In some embodiments, the substrate ST may be a glass carrier, a ceramic carrier, or the like. The adhesive layer AL may be a light to heat conversion release coating (LTHC), or the like. In some embodiments, an insulation layer 217 may be optionally disposed on the substrate ST, or on the adhesive layer AL (if any).

In some embodiments, a plurality of through vias 213 are provided on the substrate ST, and the through vias 213 surrounds a device mounting region where the semiconductor device 211a is disposed. In some embodiments, the semiconductor device 211a may be logic chips including logic circuits therein. In some exemplary embodiments, the number of the semiconductor device 211a may be plural and are device dies that are designed for mobile applications, and may include a Power Management Integrated Circuit (PMIC) die and a Transceiver (TRX) die, for example.

In some embodiments, the substrate ST may include a plurality of device mounting regions arranged in, for example, an array manner. Accordingly, the through vias 213 may be formed to surround each of the regions, and a plurality of semiconductor device 211a may be disposed on the device mounting regions respectively, so the through vias 213 may surround each of the semiconductor devices 211a. With such arrangement, a plurality of semiconductor packages can be formed concurrently. For the sake of brevity and clarity, the manufacturing process of one of the semiconductor package is illustrated in FIG. 2 to FIG. 8.

Figure 3:
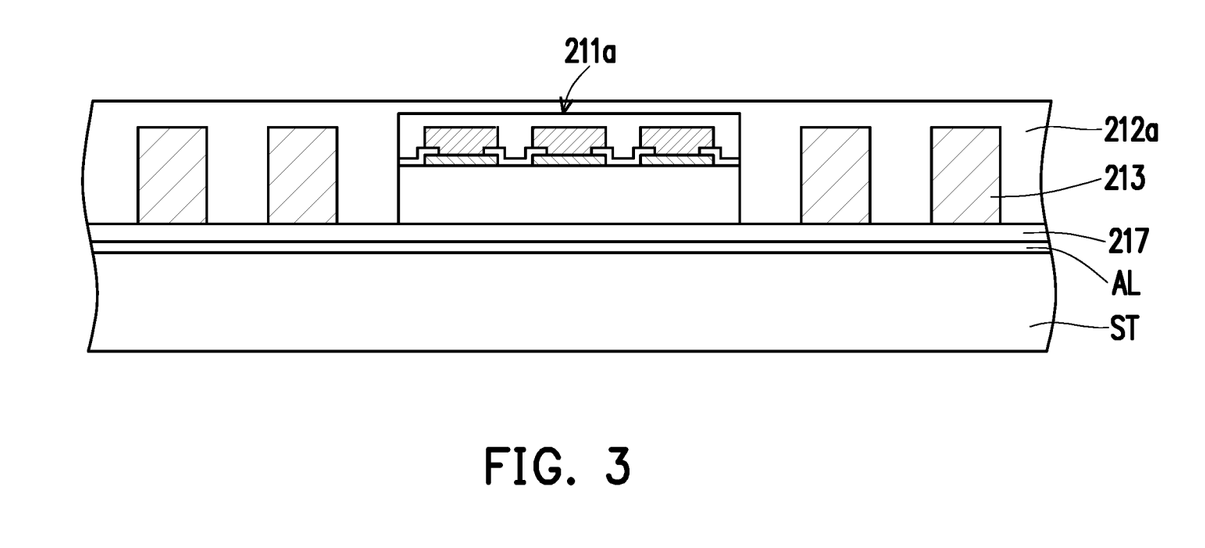

Then, referring to FIG. 3, the semiconductor device 211a and the through vias 213 on the substrate ST are encapsulated by an encapsulating material 212a. In other words, the encapsulating material 212a is provided over the substrate ST to at least laterally encapsulate the through vias 213 and the semiconductor device 211a. In some embodiments, the encapsulating material 212a may include a molding compound, an epoxy, or a resin, etc. In some embodiments, the encapsulating material 212a may cover the top ends of the through vias 213 and the top surface of the semiconductor device 211a.

Figure 4:
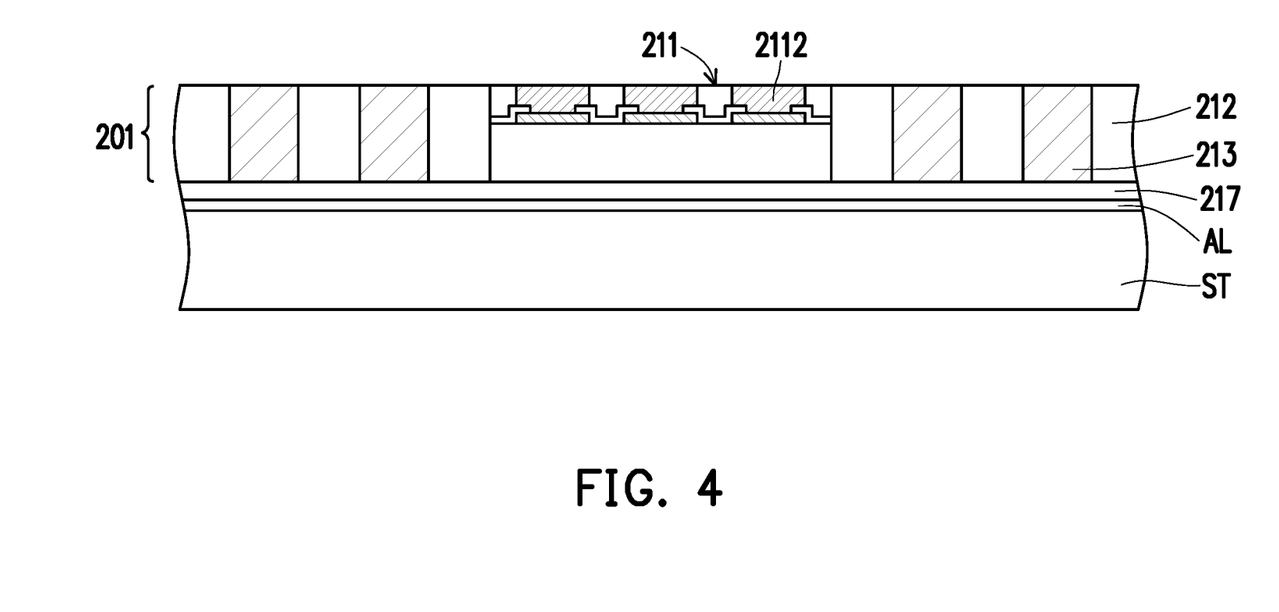
Figure 5:
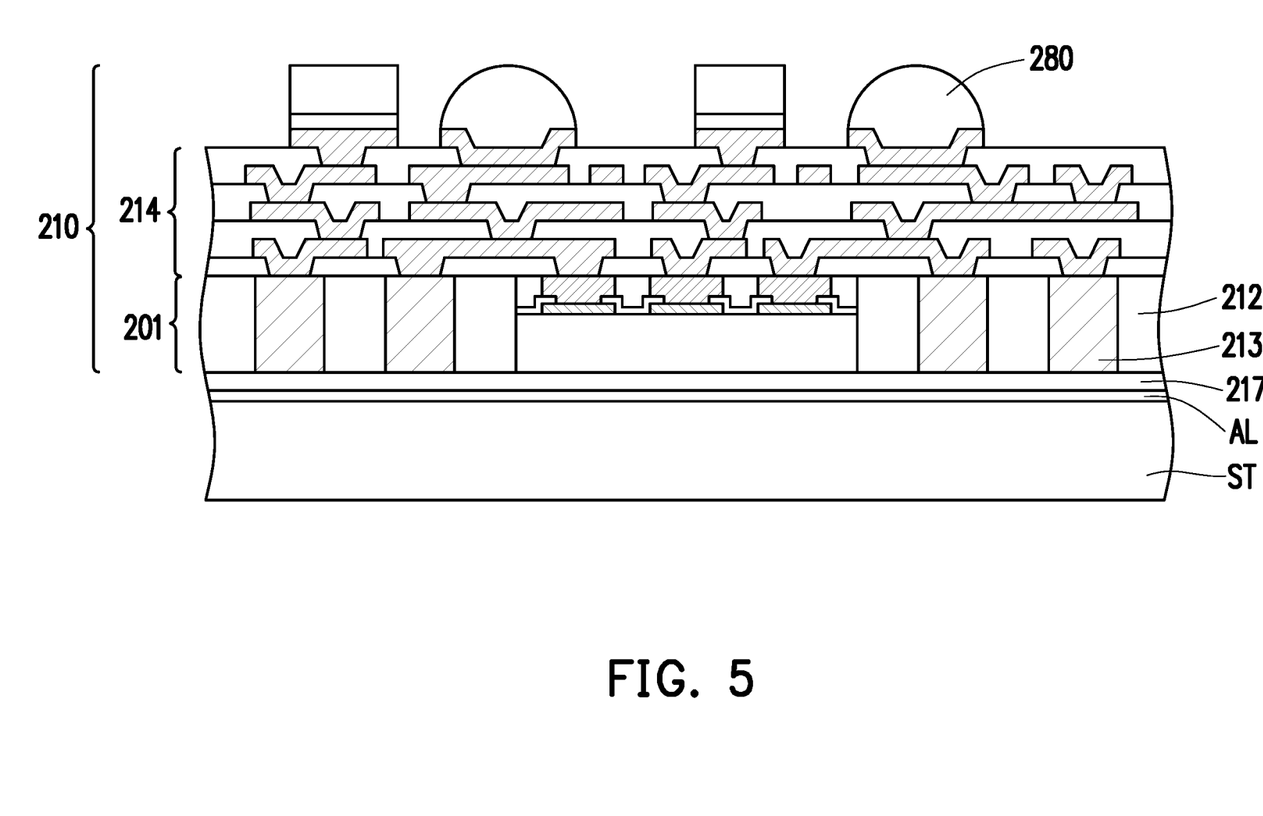

Then, referring to FIG. 3 and FIG. 4, a thinning process, which may be a grinding process, is performed to thin the encapsulating material 212a until the top ends of the through vias 213 and the electrical contacts 2112 of the semiconductor device 211a are revealed. The resulting structure is shown in FIG. 4. Due to the thinning process, the top ends of the through vias 213 are substantially level with the top surfaces of the electrical contacts 2112, and are substantially level with the top surface of the encapsulating material 212 as shown in FIG. 4. Throughout the description, the resultant structure including the semiconductor device 211, the through vias 213 and the encapsulating material 212 as shown in FIG. 4 is referred to as an encapsulated semiconductor device 201, which may have a wafer form in the process.

Then, any required processes can be sequentially performed on encapsulated semiconductor device 201 to form the reconstructed wafer. For example, referring to FIG. 5, a redistribution structure 214 may be formed on over the encapsulated semiconductor device 201. The redistribution structure 214 is electrically connected to the semiconductor device 211 and the through vias 213 of the encapsulated semiconductor device 201. The redistribution structure 214 may be formed by, for example, depositing conductive layers, patterning the conductive layers to form redistribution circuits, partially covering the redistribution circuits and filling the gaps between the redistribution circuits with dielectric layer, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the semiconductor device 211 and the through vias 213. In addition, an Under Bump Metallurgy (UBM) layer may be formed on the redistribution structure 214 by sputtering, evaporation, or electroless plating, etc. In some embodiments, at least one electrical connector 280 and/or at least one Integrated Passive Device (IPD) may be disposed on the redistribution structure 214 in accordance with some exemplary embodiments. The formation of the electrical connector 280 may include placing solder balls on the redistribution structure 214, and then reflowing the solder balls. In alternative embodiments, the formation of the electrical connector 280 may include performing a plating process to form solder regions on the redistribution structure 214, and then reflowing the solder regions. The electrical connector 280 may also include conductive pillars, or conductive pillars with solder caps, which may also be formed through plating. At the time, a reconstructed wafer 210 may be formed on the substrate ST. It is noted that the processes required to form the reconstructed wafer and the detail structure of the reconstructed wafer are not limited in the disclosure. For purpose of clarity and brevity, the reconstructed wafer 210 in the following drawings would be shown in an abstract form as a layer for convenience.

Figure 6:
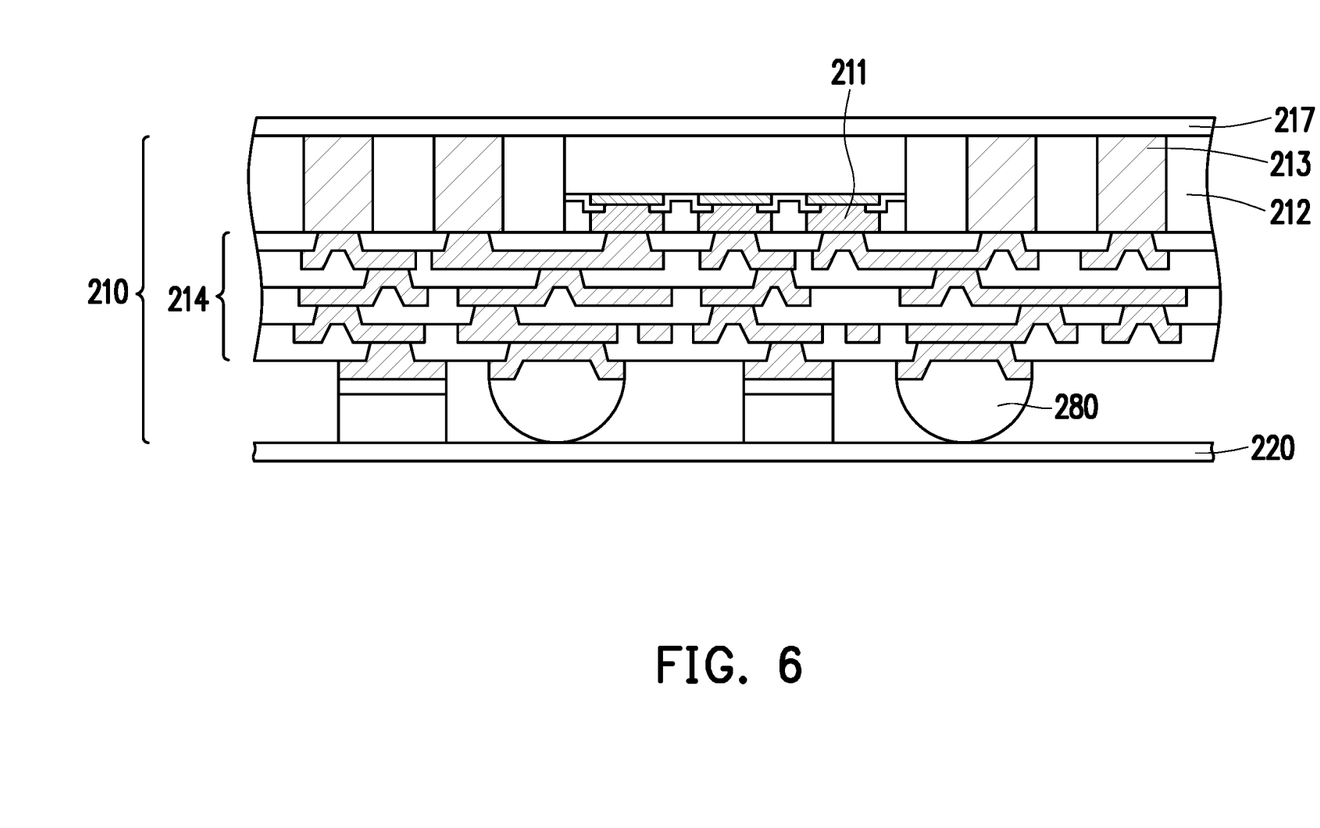
Figure 7:
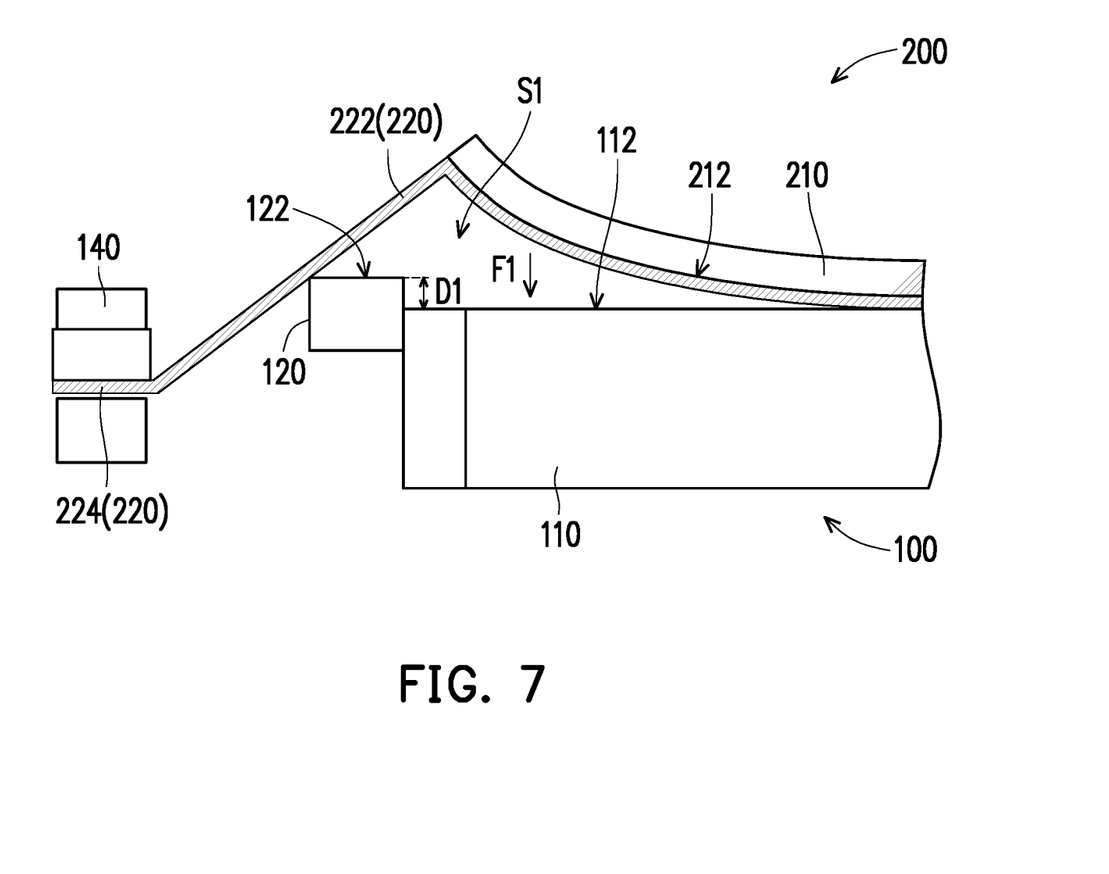
Figure 8:
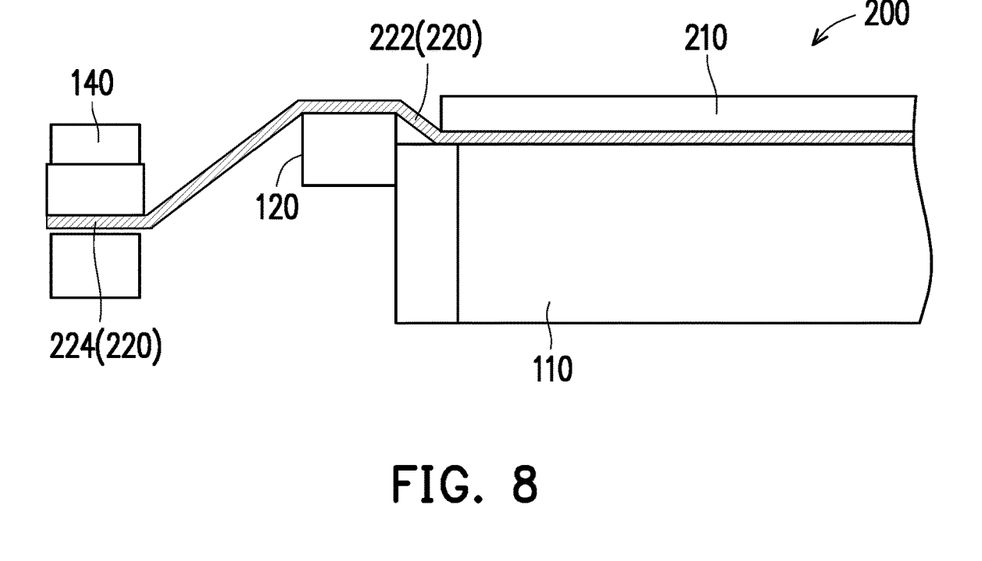

With now reference to FIG. 6 and FIG. 7, in a subsequent process, the reconstructed wafer 210 may be attached to the tape carrier 220 and then demounted (debonded) from the (glass) substrate ST. For example, the substrate ST may be debonded by projecting a light on the adhesive layer AL of the substrate ST, and the light (such a laser beam) penetrates through the transparent substrate ST. The adhesive layer AL is thus decomposed, and reconstructed wafer 210 is released from the substrate ST. In general, after the de-bonding process, the reconstructed wafer 210 may suffer from significant warpage issue, which may cause the vacuum force F1 and the supporting force from the wafer chuck 100 distribute unevenly and lead to poor yield rate of the sequential processes to be performed on the wafer chuck 100. In some exemplary embodiments, the sequential process may be performed on the reconstructed wafer 210 on the wafer chuck 100, and the process may include, for example, patterning (laser drilling) process performed on the insulation layer 217 of the reconstructed wafer 210, solder paste printing, singulation (die sawing) process, etc. However, the disclosure is not limited thereto.

In some embodiments, the workpiece holder (wafer chuck) 100 includes a chuck body 110 and a seal ring 120. In some embodiments, the chuck body 110 includes a receiving surface 112 and at least one vacuum port (e.g. four vacuum ports 114 illustrated in FIG. 4, but not limited thereto). In some embodiments, the receiving surface 112 is configured to receive the workpiece 200 and the vacuum port 114 may be configured to form a vacuum seal by applying a vacuum seal F1. In some embodiments, the vacuum port 114 may be disposed on the receiving surface 112 while a vacuum device (not illustrated) may be coupled to the chuck body 110 and in a fluid communication with the vacuum port 114. For example, the vacuum device may include a vacuum pump, or the like. In such embodiments, the vacuum device is configured to apply the vacuum force F1 to the backside of the workpiece 200 to hold the workpiece 200 in place, for example, to hold the workpiece 200 to the receiving surface 112. In some embodiments, the vacuum ports 114 can also be used to neutralize the vacuum to "de-chuck" the workpiece 200 after the process to be performed is completed. Accordingly, a vacuum system and/or an air compressor may be in fluid communication with the vacuum ports 114 to provide vacuum for holding the wafer 210 and/or for providing pressurized air in the vacuum ports 114. The disclosure is not limited thereto.

When the various components are assembled together, they form, for example, a circular chuck body 110, which is substantially planar at both the top and bottom surfaces. In some embodiments, the chuck body 110 may be a rigid circular plate for forming the base (or lower portion) of the workpiece holder (wafer chuck) 100. In some embodiments, the underside of the chuck body 110 may be coupled to a shaft (also referred to as a spindle or mandrel), which supports the workpiece holder (wafer chuck) 100 in place. Openings or holes through the chuck body 110 allow fastening means (screws, bolts, etc.) to be used to mount the chuck body 110 onto the shaft. In some embodiments, openings are also present for passage of fluid, such as air or inert gas, or for providing vacuum (e.g. vacuum ports 114).

In some embodiments, the wafer chuck 100 may further include a rotational mechanism configured to rotate/spin the chuck body 110 around an axis of shaft, which extends along a direction normal to the center of the receiving surface 112. The shaft may be coupled to the rotational mechanism such as a spindle motor, or the like. Accordingly, the chuck body 110 and the shaft are spun by the rotational mechanism. In some embodiments, the shaft is hollow, thereby permitting passage of fluid, such as air, through the vacuum ports 114, so as to create a vacuum condition between the wafer chuck 100 and the workpiece 200 by the vacuum ports 114. In some embodiments, the vacuum ports 114 may be connected to the vacuum device by way of a plurality of vacuum lines or passages, running along an axis of the shaft and converging at, for example, the center of the shaft. In some embodiments, the wafer chuck 100 may further include a gas valve disposed within the shaft to control the vacuum performance (e.g. on and off, strong or weak, etc.) of the vacuum device. The purpose of the vacuum device is to provide a securing arrangement for the wafer 210 in addition to the chuck body 110.

In accordance with some embodiments of the disclosure, the seal ring 120 may surround an outermost side surface 116 of the chuck body 110. In other words, the seal ring 120 may be seen as an O-ring for surrounding a periphery of the chuck body 110. In other words, the seal ring 120 may be a continuous annular ring for encircling the outermost side surface 116 of the chuck body 110. However, in other embodiments, the seal ring 120 may be in any shape suitable for a particular application. In some exemplary embodiments, the outer edge of the wafer 210 may extend to the outer rim (or edge) of the chuck body 110, but not beyond the outermost side surface 116 where the seal ring 120 is disposed. In other words, the sealing ring 120 may be apart from the outer edge of the wafer 210 from a top view. In some embodiments, a top surface 122 of the seal ring 120 is higher than the receiving surface 112 of the chuck body 110. In such configuration, the workpiece 200 would lean against the seal ring 120 when the vacuum force F1 is applied to form a vacuum seal between the workpiece 200 and the chuck body 110. In some exemplary, a vertical distance D1 between the top surface 122 of the seal ring 120 and the receiving surface 112 substantially ranges from 1.5 mm to 3.5 mm. In one embodiments, the vertical distance D1 may substantially range from 2 mm to 3 mm, but the disclosure is not limited thereto. In detail, the carrier (tape carrier) 220 is configured to lean against the seal ring 120 while the workpiece body (wafer) 210 is disposed on the carrier (tape carrier) 220. Accordingly, when the wafer 210 along with the tape carrier 220 are placed on the receiving surface 112, the tips of the seal rings 120 physically contact with the tape carrier 220 to allow the tape carrier 220 to reside thereon, and to form a sealing state between the wafer chuck 110 and the tape carrier 220 when vacuum is applied.

Referring to FIG. 2 and FIG. 3, in accordance with some exemplary embodiments, to hold the workpiece body (wafer) 210 by the workpiece holder (wafer chuck) 100, the workpiece body (wafer) 210 may be firstly attached to the carrier (tape carrier) 220. In some exemplary embodiments, the wafer 210 may be warped across a surface thereof, wherein the warpage is a result of previous processing applied on the wafer 210. For example, a thin layer (not shown) of material formed on a top surface of the wafer 210 generally warps the wafer 210 in a concave (smiling shape) or convex (crying shape) manner. In some embodiments, if the residual stress in the wafer 210 causes the outer edges to warp upwards, the wafer 210 is in a concave warped (i.e. the warpage of the wafer 210 is in negative value) manner. In this case, a periphery of the wafer 210 may be extended away from the wafer chuck 100 while a center region of the wafer 210 may be in contact with the wafer chuck 100 (through tape carrier 220). In some embodiments, the wafer 210 may be placed on the chuck body 110 in a form of concave and the tape carrier 220 attached to the wafer 210 covers the back surface 212 of the wafer 210 in a conformal manner. In some embodiments, the tape carrier 220 extends beyond the periphery of the chuck body 110 as it is shown in FIG. 7 and leans against the seal ring 120.

In some exemplary embodiments, the carrier (tape carrier) 220 may include a tape portion 222 and a frame portion 224 disposed at a periphery of the tape portion 222. In some embodiments, the tape portion 222 and the frame portion 224 are capable of temporarily fixing a position of the wafer 210 during any suitable tape based process such as chemical mechanical polishing (CMP), laser drilling, solder paste printing, die sawing, etc. After the tape based process, the frame portion 224 may be reusable, and the tape portion 222 may be removed from the frame portion 224, but the disclosure is not limited thereto.

Figure 9:
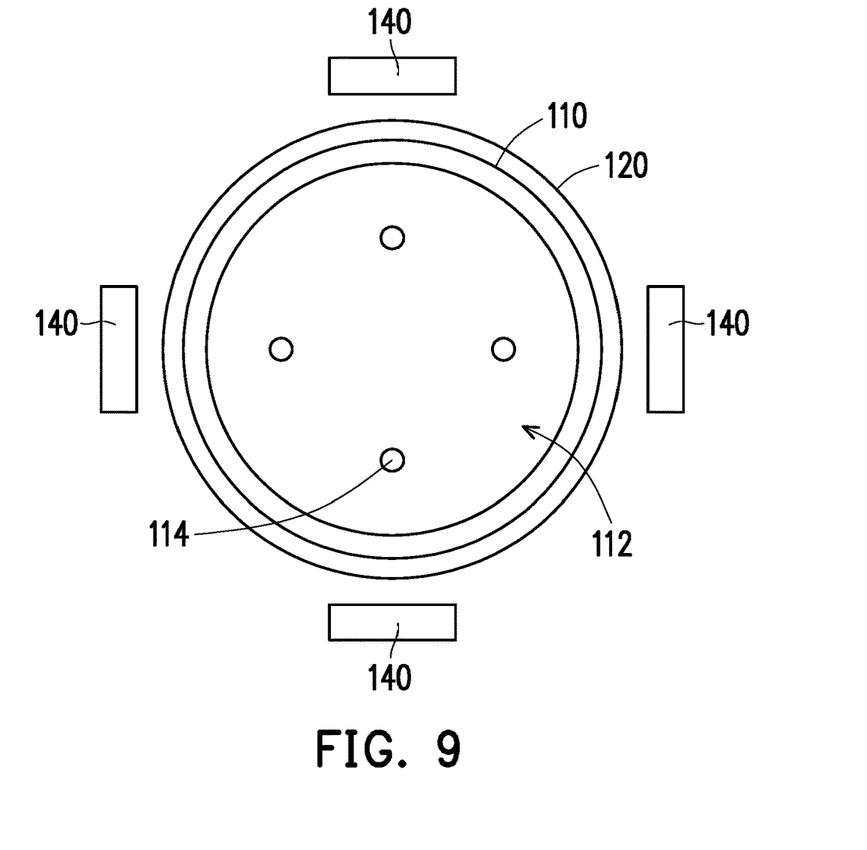
FIG. 9 illustrates a top view of a workpiece holder according to some exemplary embodiments of the present disclosure.

FIG. 9 illustrates a top view of a workpiece holder according to some exemplary embodiments of the present disclosure. Referring to FIG. 7 and FIG. 9, then, in some exemplary embodiments, the workpiece body (wafer) 210 along with the carrier (tape carrier) 220 are provided on the workpiece holder (wafer chuck) 100. The top surface of the seal ring 120 does not overlap the receiving surface 112 of the chuck body 110 from a top view as it is shown in FIG. 9. In some embodiments, the wafer 210 are provided on the wafer chuck 100 in concave-warped manner, and the tape portion 222 of the tape carrier 220 attached thereto covers the back surface 212 of the wafer 210 in a conformal manner. In some embodiments, the workpiece holder (wafer chuck) 100 may further include at least one clamping element 140 disposed at a side of the chuck body 110, and the tape carrier 220 leans against the seal ring 120 when the tape carrier 220 is fixed (clamped) by the clamping element 140 disposed outside the chuck body 110. In some exemplary embodiments, the clamping element 140 may be a mechanical clamp, or the like. In some exemplary embodiments, it is the tape portion 222 that leans against the seal ring 120 when the frame portion 224 is clamped by the clamping element 140.

In the present embodiment, multiple vacuum ports 114 are provided on the chuck body 110. The use of multiple vacuum ports 114, distributed at different locations on the chuck body 110, reduces the presence of localized low pressure regions between the chuck body 110, the wafer 210, and the tape carrier 220 since it share the pressure at which each vacuum port 114 can operate to achieve an uniform vacuum pressure. In other words, a uniform vacuum pressure can be achieved between the chuck body 110 and the workpiece 200 by operating a larger number of vacuum ports 114. Therefore, the use of multiple vacuum ports 114 can form a low pressure vacuum between the chuck body 110 and the workpiece 200, without forming localized low pressure regions that would otherwise result from the high vacuum required to affix a larger wafer 210 to the chuck body 110.

It is appreciated that the shape of the vacuum ports 114 can vary in different embodiments without substantially reducing the uniformity of the vacuum formed between the chuck body 110 and the tape carrier 220. For example, in the present embodiment, the vacuum ports 114 include circular shaped vacuum holes. In other embodiments, the vacuum ports 114 may include triangular, square, and/or polygon shaped vacuum holes. In some embodiments, the shape of one of the vacuum ports 114 may be different from that of another one of the vacuum ports 114.

In accordance with some embodiments of the disclosure, the workpiece holder (wafer chuck) 100 may include a plurality of clamping elements 140 as it is shown in FIG. 9. In some embodiments, four clamping elements 140 are illustrated herein, and the clamping elements 140 are disposed at four sides (e.g. the front side, the back side, the right side, and the left side) of the chuck body 110. Certainly, the embodiment is merely for illustration and the disclosure does not limit the number and the position of the clamping element 140. In some exemplary embodiments, the vacuum port 114 may be evenly distributed on the receiving surface 112 to form a vacuum region (or low pressure region) on the chuck body 110. In some embodiments, the seal ring 120 may define the vacuum region of the chuck body 110 encompassed by the seal ring 120. The vacuum region is in fluid communication with a vacuum device (not shown) via vacuum ports 114.

Then, in some embodiments, a vacuum force F1 (see FIG. 7) is applied by the vacuum port 114 on the receiving surface 112. Accordingly, the vacuum seal is formed/applied between the tape carrier 220 and the wafer chuck 110. At the time, the tape portion 222 of the tape carrier 220 leans against the seal ring 120 when the vacuum seal is applied between the tape carrier 220 and the chuck body 110. In other words, the seal ring 120 is in physically contact with the tape carrier 220 when the vacuum force F1 is applied, such that the tape carrier 220, the seal ring 120 and the chuck body 110 together form an enclosed space S1 and a vacuum seal is formed by evacuating gas from the enclosed space. With the configuration of the seal ring 120 protruded from the receiving surface 112, the seal ring 120 can lean against the tape carrier 220 and seal the space between the tape carrier 220 and the chuck body 110.

Accordingly, when the vacuum force F1 is applied through the vacuum port 114, the wafer 210 is pulled toward the chuck body 110 by the vacuum force F1 as it is shown in FIG. 8, such that warpage profile of the wafer 210 can be well improved (adjusted). In addition, the vacuum force F1 and the supporting force from the wafer chuck 100 can distribute more evenly. That is to say, the seal ring 120 may firstly contact the tape carrier 220 attached to the wafer 210 having concave warpage to form an initial sealing state between the tape carrier 200 (or workpiece 200 as a whole) and the wafer chuck 110. As the vacuum (or low pressure) applies under the initial sealing state, the peripheral of the warped wafer 210 is pulled toward the wafer chuck 110, so the warpage of the wafer 210 can be improved (reduced), and the seal ring 120 may be slightly deformed accordingly.

With such configuration, when the warped wafer 210 along with the tape carrier 220 are disposed on the wafer chuck 100, the seal ring 120 leans against the tape carrier 220, so as to further enhance the vacuum (or low pressure) condition between the workpiece 200 and the wafer chuck 100. In other words, owing to the configuration of the seal ring 120 higher than the receiving surface 112 carrying the wafer 210, the seal ring 120 can be in physical contact with the tape carrier 220 when vacuum (or low pressure) is applied. Accordingly, the initial sealing state can be formed and the peripheral of the warped wafer 210 can be pulled toward the wafer chuck 110 to reduce the warpage of the wafer 210. Accordingly, the wafer chuck 100 can provide sufficient support and vacuum force to the warped wafer 210, and yield rate of the sequential process to be performed on the wafer 210 can be improved. In addition, since the wafer chuck 100 provides sufficient and even support and vacuum force to the warped wafer 210, the wafer chuck 100 is capable of handling the wafer 210 prone to more significant warpage, for example, the wafer 210 being larger in size. In one of the implementation, the wafer chuck 100 is capable of handling the wafer 210 with significant warpage up to about 5000 μm, but the disclosure is not limited thereto.

Figure 10:
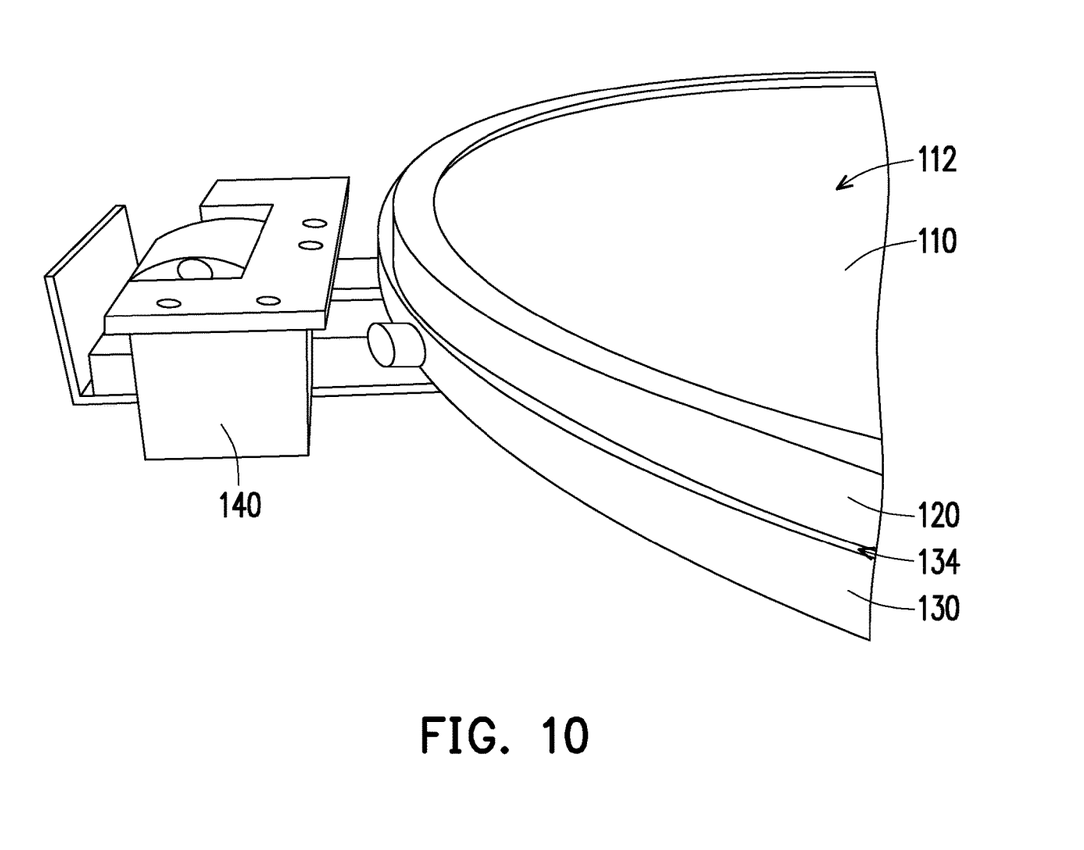
FIG. 10 illustrates a perspective view of a workpiece holder according to some exemplary embodiments of the present disclosure.

FIG. 10 illustrates a perspective view of a workpiece holder according to some exemplary embodiments of the present disclosure. Referring to FIG. 1 and FIG. 10, in some embodiments, the wafer chuck (workpiece holder) 100 may further include a supporter 130, which is disposed at the outermost side surface 116 and includes a groove 134 for receiving the seal ring 120. In accordance with some embodiments of the disclosure, a stepped groove 134 may be present for accepting the seal ring 120. To be more specific, a bottom surface of the stepped groove 134 meets (extends to) the side surface (i.e., the surface immediately adjacent to the chuck body 110) of the supporter 130. As such, at least a part of the sealing ring 120 is disposed within the groove 134, so that the supporter 130 is configured to hold the seal ring 120 in place. In some embodiments, the supporter 130 may be in the same shape (e.g. circular shape) as the chuck body 110 for surrounding the outermost side surface 116 of the chuck body 110. The supporter 130 may further include a plurality of fasten elements to locked the supporter 130 to the chuck body 110. In some exemplary embodiments, the fasten elements may include a plurality of screws respectively extending through the supporter 130 to locked the supporter 130 in place. The seal ring 120 may be placed in the groove 134, so as to maintain the position of the seal ring 120 in a way that the top surface of the seal ring 120 is higher than the receiving surface 112.

Figure 11A:
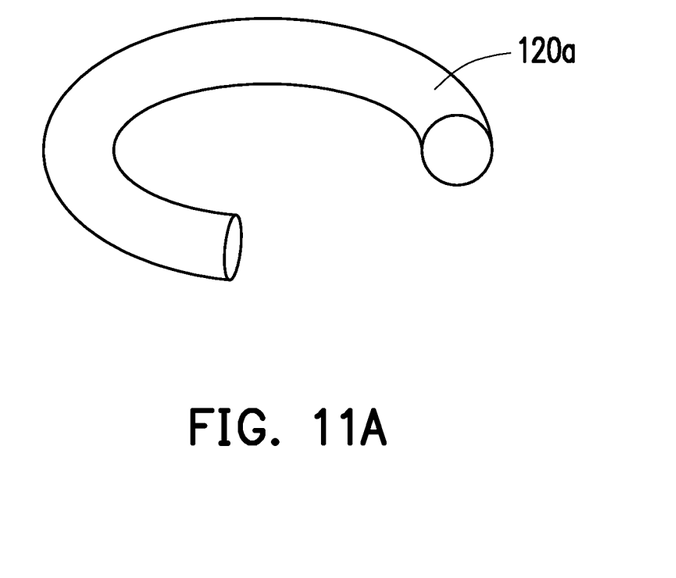
FIG. 11A and FIG. 11B illustrate cross sectional views of sealing rings according to some exemplary embodiments of the present disclosure.
Figure 11B:
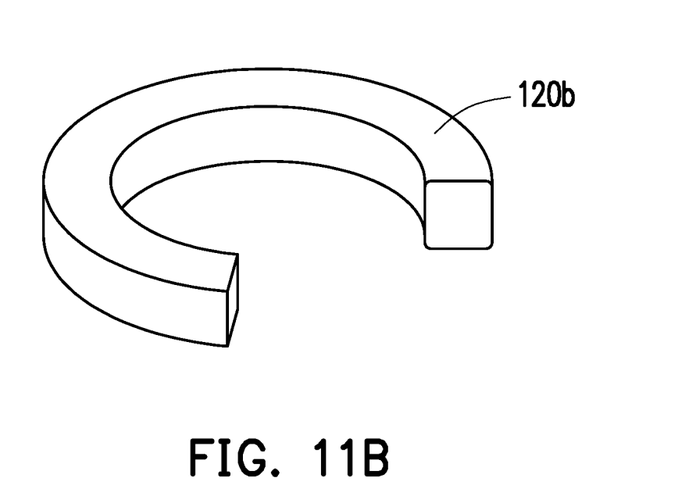

FIG. 11A and FIG. 11B illustrate cross sectional views of sealing rings according to some exemplary embodiments of the present disclosure. Referring to FIG. 10 to FIG. 11B, in accordance with some embodiments of the disclosure, the seal ring 120, in a form of an elastomer, may be placed along the outer periphery of the chuck body 110. In one of the implementation, the seal ring 120 may be a rubber O-ring which fits tightly around the periphery of the chuck body 110. In some embodiments, the seal ring 120 may be made with elastic material such as rubber, silicone rubber, polyurethane (PU) or any other suitable elastic or flexible material, and may be stretched to encompass the outer edge (i.e. the outermost side surface) of the chuck body 110. The material of the sealing ring 120 should include the characteristic of sufficient hardness to retain the seal ring 120 expanded in place around the outer rims of the chuck body 110. On the other hand, the material of the seal ring 120 should also be compliant enough to allow slight deformation for forming a better sealing state with the workpiece 200. In some embodiments, a cross section of the seal ring 120 may be, for example, in a circular, a rectangular, or a square shape, but the disclosure is not limited thereto.

Figure 12:
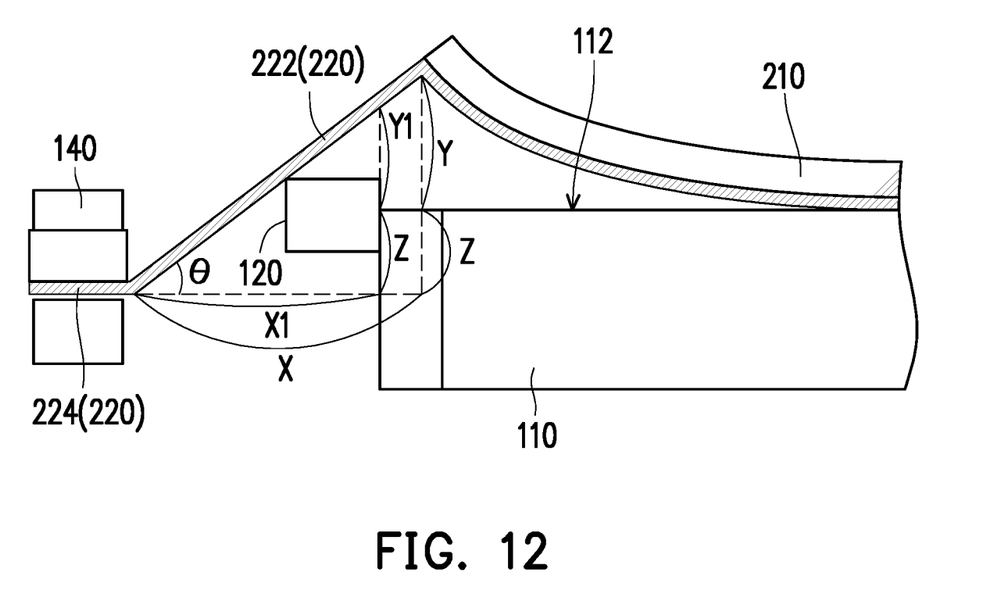
FIG. 12 illustrates a partial cross sectional view of a workpiece holder according to some exemplary embodiments of the present disclosure.

FIG. 12 illustrates a partial cross sectional view of a workpiece holder according to some exemplary embodiments of the present disclosure. Referring to FIG. 7, in some embodiments, a vertical distance Y from an outer edge of the workpiece body (wafer) 210 to the receiving surface 112 is 1.5 to 5 times as long as a vertical distance $Y_1$ from an outer edge of the receiving surface 112 to the carrier (tape carrier) 220. In some embodiments, the vertical distance Y can actually be seen as the warpage amount of the wafer (workpiece body) 210. Accordingly, by measuring the warpage amount of the wafer (workpiece body) 210, the vertical distance $Y_1$, which denotes the shortest distance between the tape carrier (carrier) 220 and the outer rim of the chuck body 110, can be obtained. Accordingly, the position and the dimension of the seal ring 120 can be obtained.

In some exemplary embodiments, a metrology device is configured to measure an amount of warpage of the wafer (workpiece body) 210 in situ in the tool where the fabrication process is performed. For example, the metrology device may have a scanning laser configured for measuring the distance between the laser and the top surface of the wafer (workpiece body) 210, to detect a height profile of the top surface wafer (workpiece body) 210. In some exemplary embodiments, data are measured indicating an amount of warpage of the wafer 210. In some embodiments, the measuring includes measuring a height of a plurality of points on a top surface of the wafer 210. For example, the measuring may include scanning the height of the top surface of the wafer 210 with a laser. In some embodiments, the laser of the metrology device scans back and forth across the surface of the wafer 210. In other embodiments, the laser beam is stationary, and the chuck body 110 holding the wafer 210 may reciprocate back and forth in, for example, the X and Y directions to cause the fixed beam to scan across the surface of the wafer 210. The disclosure is not limited thereto.

The proportionality relationship between the vertical distance Y and the vertical distance $Y_1$ can be satisfied in many different configurations for the seal ring 120 to be able to lean against the carrier (tape carrier) 220 and form the initial sealing state. In one of the exemplary embodiments, the proportionality relationship between vertical distance Y and vertical distance $Y_1$ can be determined by the equation Eq. (1) listed below:

$$\tan \theta = \frac{(Y_1 + Z)}{X_1} = \frac{(Y + Z)}{X} \qquad \text{Eq. (1)}$$

Accordingly, the vertical distance $Y_1$ can be determined by the equation Eq. (2) listed below:

$$Y1 = \frac{X_1}{X}(Y + Z) - Z \qquad \text{Eq. (2)}$$

Where θ is denoted as the angle between the tape carrier and a reference horizontal line extended from a base point of the clamping element 140; Z is denoted as a vertical distance between the receiving surface 112 to the reference horizontal line; $X_1$ is denoted as a horizontal distance between the chuck body 110 and the base point of the clamping element 140; and X is denoted as a horizontal distance between an outer edge of the wafer (workpiece body) 210 and the base point of the clamping element 140. In some embodiments, the base point is where the clamping element 140 clamps the frame portion 224 of the tape carrier 220, but the disclosure is not limited thereto. Accordingly, by solving the Eq. (2) for the vertical distance $Y_1$, the position and the dimension of the seal ring 120 can be obtained, such that the seal ring 120 can be configured in a way that is able to lean against the carrier (tape carrier) 220 and form the initial sealing state therewith.

In light of the foregoing, when the workpiece body (wafer) 210 along with the carrier (tape carrier) are disposed on the workpiece holder (wafer chuck) 100, the seal ring 120 leans against the tape carrier 220, so as to further enhance the vacuum (or low pressure) condition between the workpiece 200 and the workpiece holder (wafer chuck) 100. In other words, owing to the configuration of the seal ring 120 higher than the receiving surface 112 of the chuck body 110, the seal ring 120 can be in physical contact with the tape carrier 220 when vacuum (or low pressure) is applied. Accordingly, the initial sealing state can be formed and the peripheral of the warped wafer 210 can be pulled toward the wafer chuck 110 to reduce the warpage of the wafer 210. Accordingly, the wafer chuck 100 can provide sufficient support and vacuum force to the warped wafer 210, and yield rate of the sequential process to be performed on the wafer 210 can be improved. In addition, since the wafer chuck 100 provides sufficient and even support and vacuum force to the warped wafer 210, the wafer chuck 100 is capable of handling the wafer 210 prone to more significant warpage, for example, the wafer 210 being larger in size. In one of the implementation, the wafer chuck 100 is capable of handling the wafer 210 with significant warpage up to about 5000 μm, but the disclosure is not limited thereto.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a workpiece holder includes a chuck body and a seal ring. The chuck body includes a receiving surface configured to receive a workpiece and at least one vacuum port configured to apply a vacuum seal. The seal ring surrounds an outermost side surface of the chuck body. A top surface of the seal ring is higher than the receiving surface of the chuck body, and the workpiece leans against the seal ring when the vacuum seal is applied between the workpiece and the chuck body.

In accordance with some embodiments of the disclosure, a wafer chuck includes a chuck body and a seal ring. The chuck body includes a receiving surface configured to receive a wafer. The seal ring is disposed on an outermost side surface of the chuck body and surrounds a periphery of the chuck body, wherein a top surface of the seal ring is higher than the receiving surface of the chuck body.

In accordance with some embodiments of the disclosure, a wafer holding method includes the following steps. A wafer is attached on a tape carrier. The wafer with the tape carrier are provided on a wafer chuck, wherein the wafer chuck includes a chuck body having the receiving surface and a seal ring surrounding a periphery of the chuck body, and a top surface of the seal ring is higher than the receiving surface of the chuck body. The tape carrier is clamped, wherein the tape carrier leans against the seal ring. A vacuum seal is applied between the tape carrier and the wafer chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor package, comprising:
    providing a semiconductor device on a substrate;
    providing an encapsulating material over the substrate to at least laterally encapsulate the semiconductor device and form a reconstructed wafer attaching the reconstructed wafer to a tape carrier;
    debonding the substrate from the reconstructed wafer;
    providing the reconstructed wafer with the tape carrier on a wafer chuck, wherein the wafer chuck comprises a chuck body and a seal ring surrounding a periphery of the chuck body, and a top surface of the seal ring is higher than a receiving surface of the chuck body;
    fixing the tape carrier outside the chuck body, wherein the tape carrier leans against the seal ring and an enclosed space is formed between the chuck body, the tape carrier and the seal ring;
    forming a vacuum seal by evacuating gas from the enclosed space to pull the periphery of the reconstructed wafer toward the chuck body; and
    processing the reconstructed wafer on the wafer chuck;
    wherein, when the enclosed space is formed between the chuck body, the tape carrier and the seal ring, a vertical distance from an outer edge of the reconstructed wafer to the receiving surface of the chuck body is 1.5 to 5 times as long as a vertical distance from an outer edge of the receiving surface of the chuck body to the tape carrier.

2. The method as claimed in claim 1, wherein the vacuum seal is applied by a vacuum port on the receiving surface after the tape carrier is fixed outside the chuck body.

3. The method as claimed in claim 1, wherein fixing the tape carrier outside the chuck body comprises clamping the tape carrier by a clamping element disposed at a side of the chuck body.

4. The method as claimed in claim 1, wherein fixing the tape carrier comprises clamping a frame portion of the tape carrier while a tape portion of the tape carrier leans against the seal ring.

5. The method as claimed in claim 1, further comprising:
    performing a thinning process to thin the encapsulating material until a top surface of the semiconductor device is revealed.

6. The method as claimed in claim 1, wherein the wafer chuck further comprises a supporter disposed at the outermost side surface and comprising a groove, and at least a part of the sealing ring is disposed within the groove.

7. The method as claimed in claim 1, further comprising:
    providing a plurality of through vias on the substrate before the encapsulating material is provided over the substrate, wherein the encapsulating material laterally encapsulates the plurality of through vias.

8. The method as claimed in claim 1, wherein forming the reconstructed wafer further comprises:
    forming a redistribution structure over the encapsulating material and the semiconductor device.

9. A method of handling a wafer, comprising:
    attaching a wafer to a tape carrier;
    placing the wafer with the tape carrier on a wafer chuck, wherein the wafer chuck comprises a chuck body and a seal ring surrounding a periphery of the chuck body, and a top surface of the seal ring is higher than a receiving surface of the chuck body;
    clamping the tape carrier outside the chuck body, wherein the tape carrier leans against the seal ring and an enclosed space is formed between the chuck body, the tape carrier and the seal ring;
    forming a vacuum seal by evacuating gas from the enclosed space to pull the periphery of the reconstructed wafer toward the chuck body; and
    processing the wafer on the wafer chuck;
    wherein, when the enclosed space is formed between the chuck body, the tape carrier and the seal ring, a vertical distance from an outer edge of the wafer to the receiving surface of the chuck body is 1.5 to 5 times as long as a vertical distance from an outer edge of the receiving surface of the chuck body to the tape carrier.

10. The method as claimed in claim 9, wherein the vacuum seal is applied after the tape carrier is clamped outside the chuck body.

11. The method as claimed in claim 9, wherein clamping the tape carrier outside the chuck body comprises clamping the tape carrier by a clamping element disposed at a side of the chuck body.

12. The method as claimed in claim 11, wherein the clamping element is spaced apart from the seal ring.

13. The method as claimed in claim 9, wherein the tape carrier comprises a tape portion and a frame portion disposed at a periphery of the tape portion for fixing the tape carrier, and clamping the tape carrier comprises clamping the frame portion while the tape portion of the tape carrier leans against the seal ring.

14. The method as claimed in claim 9, wherein when the wafer with the tape carrier is placed on the wafer chuck, a tip of the seal ring physically contacts the tape carrier to allow the tape carrier to reside thereon.

15. The method as claimed in claim 9, wherein the wafer chuck further comprises a supporter disposed at the outermost side surface of the chuck body and comprising a groove, and a part of the sealing ring is embedded in the groove.

16. The method as claimed in claim 9, wherein when the wafer with the tape carrier is placed on the wafer chuck, the wafer is in a warped state where a center region of the wafer is in contact with the wafer chuck while a periphery of the wafer warped away from the wafer chuck, and the tape carrier attached to a back surface of the wafer in a conformal manner.

17. The method as claimed in claim 16, wherein when the vacuum seal is formed, the peripheral of the wafer is pulled to be in contact with the wafer chuck.

18. A method of handling a workpiece, comprising:
placing a workpiece on a receiving surface of a chuck body, wherein the workpiece comprises a tape carrier extending beyond a periphery of the chuck body and a workpiece body disposed on the tape carrier, and the chuck body comprises a seal ring surrounding the periphery of the chuck body;
clamping the tape carrier outside the chuck body by a clamping element, wherein the tape carrier leans against the seal ring and an enclosed space is formed between the chuck body, the tape carrier and the seal ring; and
forming a vacuum seal by evacuating gas from the enclosed space to pull the periphery of the workpiece toward the chuck body, wherein, when the enclosed space is formed between the chuck body, the tape carrier and the seal ring, a first vertical distance from an outer edge of the workpiece to the receiving surface of the chuck body is 1.5 to 5 times as long as a second vertical distance from an outer edge of the receiving surface of the chuck body to the tap carrier.

19. The method as claimed in claim 18, wherein the workpiece body comprises a semiconductor device, an encapsulating material laterally encapsulating the semiconductor device, and a redistribution structure disposed on the semiconductor device and the encapsulating material.

20. The method as claimed in claim 18, wherein when the workpiece is placed on the chuck body, the workpiece is in a warped state where a center region of the workpiece is in contact with the chuck body while a periphery of the workpiece warped away from the chuck body, and when the vacuum seal is formed, the peripheral of the workpiece is pulled to be in contact with the chuck body.

* * * * *